(12) United States Patent
Tsuchiya (10) Patent No.: US 12,347,715 B2
(45) Date of Patent: Jul. 1, 2025

(54) ELECTROSTATIC CHUCK DEVICE POWER SUPPLY, ELECTROSTATIC CHUCK DEVICE, AND DECHUCK CONTROL METHOD

(71) Applicant: HAMAMATSU PHOTONICS K.K., Hamamatsu (JP)

(72) Inventor: Takahiro Tsuchiya, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 403 days.

(21) Appl. No.: 17/801,586

(22) PCT Filed: Dec. 23, 2020

(86) PCT No.: PCT/JP2020/048193
§ 371 (c)(1),
(2) Date: Aug. 23, 2022

(87) PCT Pub. No.: WO2021/176815
PCT Pub. Date: Sep. 10, 2021

(65) Prior Publication Data
US 2023/0133839 A1 May 4, 2023

(30) Foreign Application Priority Data

Mar. 2, 2020 (JP) ................................ 2020-035316

(51) Int. Cl.
*H01L 21/683* (2006.01)
(52) U.S. Cl.
CPC ................................ *H01L 21/6833* (2013.01)
(58) Field of Classification Search
CPC ................................................. H01L 21/6833
See application file for complete search history.

(56) References Cited

U.S. PATENT DOCUMENTS

| 6,236,555 B1 * | 5/2001 | Leeser ................ H01L 21/6833 |
| | | 279/128 |
| 2003/0033116 A1 | 2/2003 | Brcka et al. |

(Continued)

FOREIGN PATENT DOCUMENTS

| CN | 101587813 A | 11/2009 |
| CN | 102029794 A | 4/2011 |

(Continued)

OTHER PUBLICATIONS

International Preliminary Report on Patentability mailed Sep. 15, 2022 for PCT/JP2020/048193.

*Primary Examiner* — Scott Bauer
(74) *Attorney, Agent, or Firm* — Faegre Drinker Biddle & Reath LLP (57) ABSTRACT

Provided is an electrostatic chuck device including: a voltage application unit configured to apply a dechuck voltage that is used when dechucking an object to a first electrode and a second electrode, the dechuck voltage being constituted by a first AC voltage applied to the first electrode in a first waveform, and a second AC voltage applied to the second electrode in a second waveform having a phase difference from the first waveform; and an information output unit configured to output information on timing at which the first waveform and the second waveform intersect each other. The voltage application unit stops application of the dechuck voltage to the first electrode and the second electrode on the basis of the information.

19 Claims, 7 Drawing Sheets

(56) References Cited

U.S. PATENT DOCUMENTS

| | | | |
|---|---|---|---|
| 2003/0165044 | A1 | 9/2003 | Yamamoto |
| 2004/0264089 | A1* | 12/2004 | Furuya .................... H02J 3/38 |
| | | | 361/92 |
| 2011/0207291 | A1 | 8/2011 | Tsuno et al. |
| 2017/0346418 | A1 | 11/2017 | Maehira et al. |

FOREIGN PATENT DOCUMENTS

| | | |
|---|---|---|
| CN | 102159356 A | 8/2011 |
| CN | 102593035 A | 7/2012 |
| JP | S62-044332 A | 2/1987 |
| JP | H01-112745 A | 5/1989 |
| JP | H06-071944 B2 | 9/1994 |
| JP | H8-250579 A | 9/1996 |
| JP | H10-111321 A | 4/1998 |
| JP | H11-297803 A | 10/1999 |
| JP | 2001-007191 A | 1/2001 |
| JP | 2002-083860 A | 3/2002 |
| JP | 2002-118164 A | 4/2002 |
| JP | 2010-087278 A | 4/2010 |
| JP | 2018-166146 A | 10/2018 |
| KR | 10-2011-0061595 A | 6/2011 |
| KR | 10-2017-0053726 A | 5/2017 |
| TW | 200835607 A | 9/2008 |

* cited by examiner

| OBJECT | FREQUENCY (Hz) | AMPLITUDE (V) |
|---|---|---|
| COPPER FRAME | 1 | 500 |
| PAPER | | 250 |
| GLASS | 0.1 | 500 |
| COPPER PLATE | | |

Fig.7

ELECTROSTATIC CHUCK DEVICE POWER SUPPLY, ELECTROSTATIC CHUCK DEVICE, AND DECHUCK CONTROL METHOD

TECHNICAL FIELD

The present disclosure relates to a power supply for an electrostatic chuck device, an electrostatic chuck device, and a dechuck control method.

BACKGROUND ART

As an electrostatic chuck device in the related art, for example, there is an electrostatic holding device described in Patent Literature 1. The electrostatic holding device in the related art includes an electrostatic holding unit in which a plurality of electrodes are arranged in an insulating layer, and a switching unit that switches a connection state between the electrostatic holding unit and a DC power supply and an AC power supply. In the electrostatic holding device, charges of the electrostatic holding unit are removed by applying an AC voltage to an electrode when dechucking an object to be held.

CITATION LIST

Patent Literature

Patent Literature 1: Japanese Examined Patent Publication No. H6-71944
Patent Literature 2: Japanese Unexamined Patent Publication No. S62-44332

SUMMARY OF INVENTION

Technical Problem

In a case of removing charges by using an AC voltage, in the related art, a method of gradually reducing the AC voltage that is applied to an electrode with the passage of time is employed (for example, refer to Patent Literature 2). However, in the method in the related art, it takes approximately several seconds until charges of a support unit are removed. Therefore, it has been a problem to shorten time taken until the object is separated from the support unit at the time of dechuck.

The present disclosure has been made to solve the problem, and an object thereof is to provide a power supply for an electrostatic chuck device which is capable of shortening time taken until an object to be held is separated from a support unit at the time of dechuck, an electrostatic chuck device, and a dechuck control method.

Solution to Problem

According to an aspect of the present disclosure, there is provided a power supply for an electrostatic chuck device. The power supply includes: a voltage application unit configured to apply a dechuck voltage that is used when dechucking an object to be held to a first electrode and a second electrode, the dechuck voltage being constituted by a first AC voltage applied to the first electrode in a first waveform, and a second AC voltage applied to the second electrode in a second waveform having a phase difference from the first waveform; and an information output unit configured to output information based on timing at which the first waveform and the second waveform intersect each other. The voltage application unit stops application of the dechuck voltage to the first electrode and the second electrode on the basis of the information.

In the power supply for an electrostatic chuck device, application of the dechuck voltage to the first electrode and the second electrode is stopped on the basis of information on timing at which the waveform of the first AC voltage and the waveform of the second AC voltage intersect each other at the time of dechuck. According to this configuration, application of the dechuck voltage to the first electrode and the second electrode can be positively stopped at timing suitable for separation of the object without waiting attenuation of the first AC voltage and the second AC voltage. Accordingly, in the power supply for an electrostatic chuck device, it is possible to shorten time taken until the object is separated from the support unit at the time of dechuck.

The information output unit may acquire the information through detection of the first AC voltage and the second AC voltage. In this case, the information output unit can appropriately output information, and application of the dechuck voltage can be stopped at timing suitable for separation of the object. Accordingly, it is possible to shorten time taken until the object is separated from the support unit at the time of dechuck.

The information output unit may retain the information based on the first AC voltage and the second AC voltage in advance. In this case, the information output unit can appropriately output the information, and application of the dechuck voltage can be stopped at timing suitable for separation of the object. Accordingly, it is possible to shorten time taken until the object is separated from the support unit at the time of dechuck.

The voltage application unit may apply the dechuck voltage to the first electrode and the second electrode so that the first waveform and the second waveform have phases opposite to each other. In this case, since a positive potential and a negative potential are alternately applied to the first electrode and the second electrode, it is possible to improve removal efficiency for charges in the support unit by the first AC voltage and the second AC voltage.

The voltage application unit may apply the dechuck voltage to the first electrode and the second electrode so that values of the first AC voltage and the second AC voltage become zero when the first waveform and the second waveform intersect each other. In this case, since application of the dechuck voltage can be stopped when the voltage values of the first AC voltage and the second AC voltage become zero, dechuck reliability can be improved.

The voltage application unit may apply the dechuck voltage to the first electrode and the second electrode so that periods indicated by the first waveform and the second waveform when initiating application of the dechuck voltage become equal to or greater than 0 and less than ½ π and equal to or greater than π and less than 3/2 π in a case where one period of the first waveform and the second waveform is set to 2 π. In this case, it is possible to shorten time taken until positive and negative absolute values of the first AC voltage and the second AC voltage become maximum values after initiating application of the dechuck voltage. Accordingly, it is possible to more effectively shorten time taken until the object is separated from the support unit at the time of dechuck.

The voltage application unit may apply the dechuck voltage to the first electrode and the second electrode so that the first waveform and the second waveform have the same amplitude. In this case, since the first waveform and the second waveform are caused to have positive and negative symmetry, it is possible to improve removal efficiency for charges in the support unit by the first AC voltage and the second AC voltage.

The voltage application unit may invert a polarity of a voltage applied to the first electrode and a polarity of a voltage applied to the second electrode in switching from a chuck voltage used when chucking the object to the dechuck voltage. In this case, it is possible to initiate removal of charges in the support unit from time immediately after initiating dechuck. Accordingly, it is possible to more effectively shorten time taken until the object is separated from the support unit at the time of dechuck.

According to another aspect of the present disclosure, there is provided an electrostatic chuck device including: the power supply for an electrostatic chuck device according to the aspect; and a support unit that includes a first electrode and a second electrode in an insulator.

In the electrostatic chuck device, application of the dechuck voltage to the first electrode and the second electrode is stopped on the basis of information on timing at which a waveform of a first AC voltage and a waveform of a second AC voltage interest each other at the time of dechuck. According to this configuration, application of the dechuck voltage to the first electrode and the second electrode can be positively stopped at timing suitable for separation of the object without waiting attenuation of the first AC voltage and the second AC voltage. Accordingly, in the electrostatic chuck device, it is possible to shorten time taken until the object is separated from the support unit at the time of dechuck.

According to still another aspect of the present disclosure, there is provided a dechuck control method including: a dechuck voltage application step of applying a first AC voltage to a first electrode in a first waveform and applying a second AC voltage to a second electrode in a second waveform having a phase difference from the first waveform; an information output step of outputting information on timing at which the first waveform and the second waveform intersect each other; and a stoppage step of stopping application of the dechuck voltage to the first electrode and the second electrode on the basis of the information output from the information output step.

In the dechuck control method, application of the dechuck voltage to the first electrode and the second electrode is stopped on the basis of information on timing at which the waveform of the first AC voltage and the waveform of the second AC voltage intersect each other at the time of dechuck. According to this, application of the dechuck voltage to the first electrode and the second electrode can be positively stopped at timing suitable for separation of the object without waiting attenuation of the first AC voltage and the second AC voltage. Accordingly, in the electrostatic chuck device, it is possible to shorten time taken until the object is separated from the support unit at the time of dechuck.

In the information output step, the information acquired through detection of the first AC voltage and the second AC voltage may be output. In this case, it is possible to appropriately output the information, and it is possible to stop application of the dechuck voltage at timing suitable for separation of an object to be held. Accordingly, it is possible to shorten time taken until the object is separated from the support unit at the time of dechuck.

In the information output step, the information retained in advance on the basis of the first AC voltage and the second AC voltage may be output. In this case, it is possible to appropriately output the information, and it is possible to stop application of the dechuck voltage at timing suitable for separation of an object to be held. Accordingly, it is possible to shorten time taken until the object is separated from the support unit at the time of dechuck.

In the application step, the dechuck voltage may be applied to the first electrode and the second electrode so that the first waveform and the second waveform have phases opposite to each other. In this case, since a positive potential and a negative potential are alternately applied to the first electrode and the second electrode, it is possible to improve removal efficiency for charges in the support unit by the first AC voltage and the second AC voltage.

In the application step, the dechuck voltage may be applied to the first electrode and the second electrode so that values of the first AC voltage and the second AC voltage become zero when the first waveform and the second waveform intersect each other. In this case, since application of the dechuck voltage can be stopped when the voltage values of the first AC voltage and the second AC voltage become zero, dechuck reliability can be improved.

In the application step, the dechuck voltage may be applied to the first electrode and the second electrode so that periods indicated by the first waveform and the second waveform when initiating application of the dechuck voltage become equal to or greater than 0 and less than $\frac{1}{2} \pi$ and equal to or greater than $\pi$ and less than $\frac{3}{2} \pi$ in a case where one period of the first waveform and the second waveform is set to $2\pi$. In this case, it is possible to shorten time taken until positive and negative absolute values of the first AC voltage and the second AC voltage become maximum values after initiating application of the dechuck voltage. Accordingly, it is possible to more effectively shorten time taken until the object is separated from the support unit at the time of dechuck.

In the application step, the dechuck voltage may be applied to the first electrode and the second electrode so that the first waveform and the second waveform have the same amplitude. In this case, since the first waveform and the second waveform are caused to have positive and negative symmetry, it is possible to improve removal efficiency for charges in the support unit by the first AC voltage and the second AC voltage.

In the application step, a polarity of a voltage applied to the first electrode and a polarity of a voltage applied to the second electrode may be inverted in switching from a chuck voltage to the dechuck voltage. In this case, it is possible to initiate removal of charges in the support unit from time immediately after initiating dechuck. Accordingly, it is possible to more effectively shorten time taken until the object is separated from the support unit at the time of dechuck.

Advantageous Effects of Invention

According to the present disclosure, it is possible to shorten time taken until an object to be held is separated from a support unit at the time of dechuck.

DESCRIPTION OF EMBODIMENTS

Hereinafter, a preferred embodiment of a power supply for an electrostatic chuck device, an electrostatic chuck device, and a dechuck control method according to an aspect of the present disclosure will be described in detail with reference to the drawings.

Figure 1:
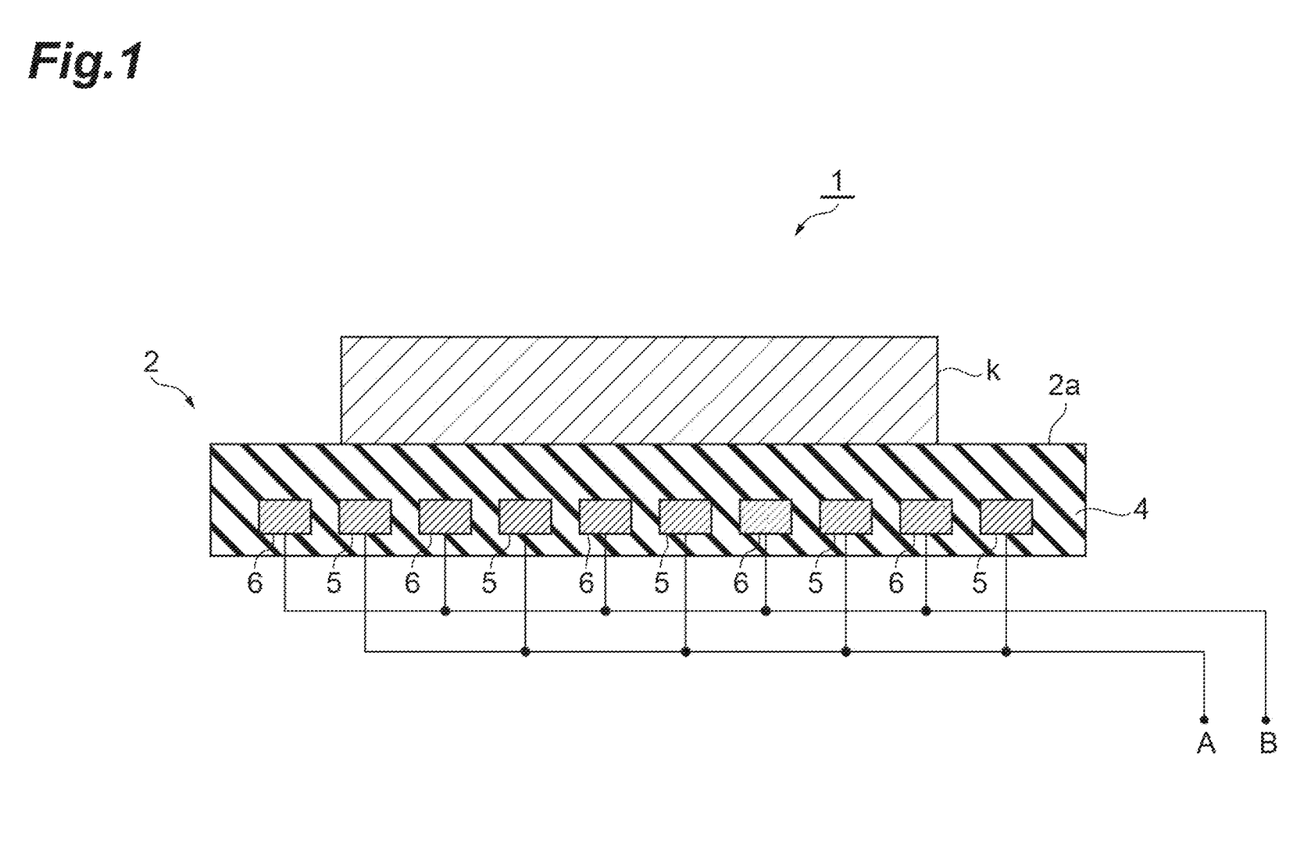
FIG. 1 is a schematic cross-sectional view illustrating an embodiment of an electrostatic chuck device.

FIG. 1 is a schematic cross-sectional view illustrating an embodiment of an electrostatic chuck device 1. The electrostatic chuck device 1 illustrated in FIG. 1 is a bipolar electrostatic chuck device capable of switching holding and non-holding of an object K to be held. The electrostatic chuck device 1 is a device that holds the object K by using an electrostatic force. The electrostatic chuck device 1 is applicable to conveyance, processing, and the like of various objects K to be held such as a silicon wafer and an IC lead frame in vacuum environment in which suction by air is difficult. The electrostatic chuck device 1 includes a support unit 2 and a power supply P for an electrostatic chuck device (refer to FIG. 2).

The support unit 2 includes an insulator 4, a first electrode 5, and a second electrode 6. For example, the insulator 4 is formed from an insulating material such as ceramic and polyimide in a plate shape. One surface side of the insulator 4 becomes a support surface 2a of the object K with the support unit 2.

The first electrode 5 and the second electrode 6 are formed from a conductive material. The first electrode 5 and the second electrode 6 include a base portion that extends in a trunk shape, and a plurality of comb-like electrodes which protrude from the base portion in a direction that is approximately orthogonal to the extension direction. In FIG. 1, only the comb-like electrodes are illustrated, and the base portion is omitted. The comb-like electrodes of the first electrode 5 and the second electrode 6 are spaced apart from each other at a constant interval, and are arranged alternately and in parallel to engage with each other. The first electrode 5 and the second electrode 6 are sealed inside the insulator 4. In this embodiment, the number of arrangement of the comb-like electrodes of the first electrode 5 and the number of arrangement of the comb-like electrodes of the second electrode 6 are the same as each other. A and B in FIG. 1 correspond to A and B in FIG. 2, and the first electrode 5 and the second electrode 6 are electrically connected to a voltage application unit 3.

The power supply P for an electrostatic chuck device is a portion that applies a voltage to the first electrode 5 and the second electrode 6, and includes the voltage application unit 3. In this embodiment, the voltage application unit 3 applies a chuck voltage that is used when chucking the object K and a dechuck voltage that is used when dechucking the object K to the first electrode 5 and the second electrode 6. A voltage application unit that applies the chuck voltage that is used when chucking the object K and a voltage application unit that applies the dechuck voltage that is used when dechucking the object K may be separate members.

Figure 4:
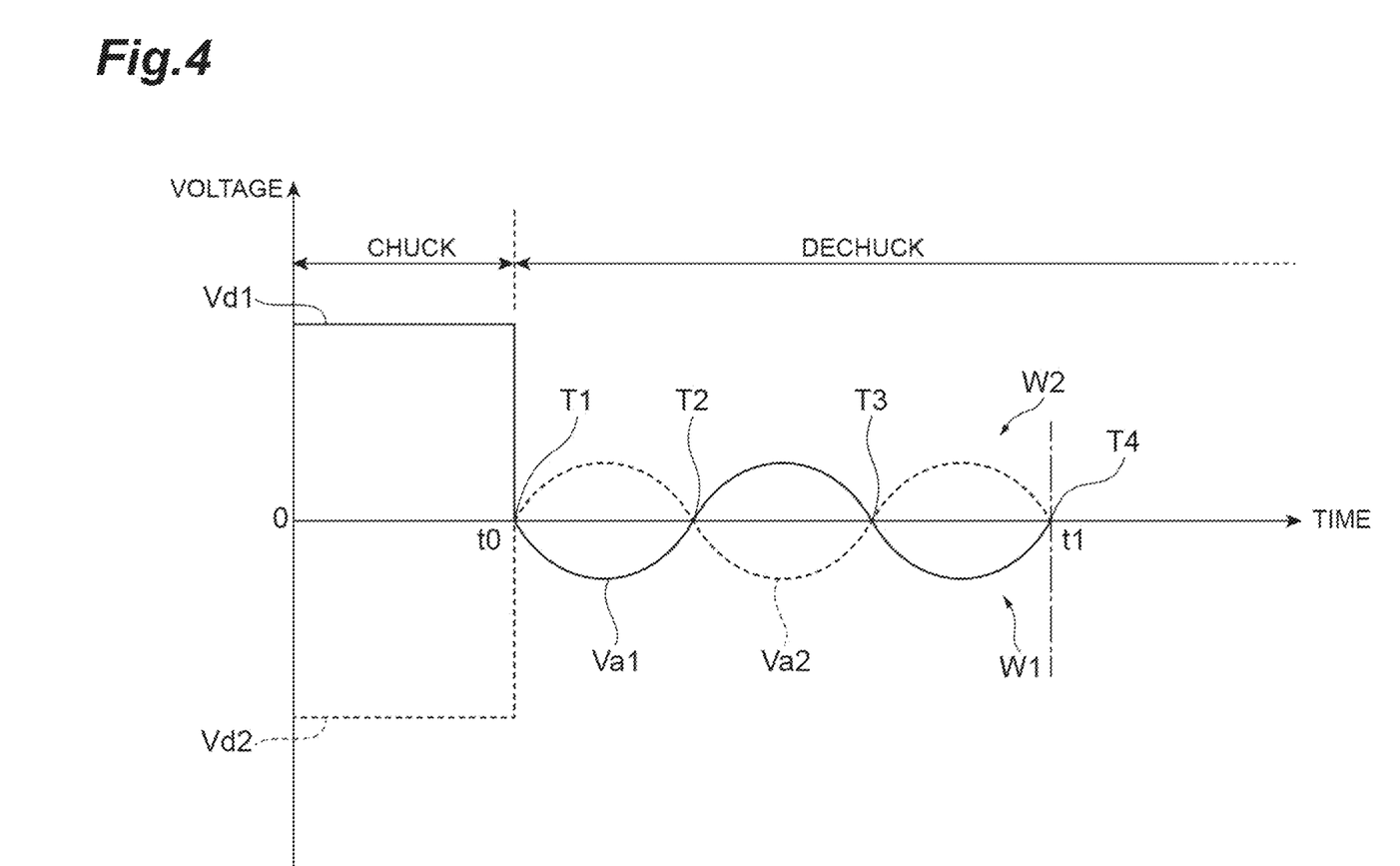
FIG. 4 is a view illustrating an example of control of a chuck voltage and a dechuck voltage by the voltage application unit.

In this embodiment, the chuck voltage is constituted by a pair of DC voltages in which positive and negative are inverted, and the dechuck voltage is constituted by a pair of AC voltages having the same amplitude and phases opposite to each other (refer to FIG. 4). When the chuck voltage is applied to the first electrode 5 and the second electrode 6, static electricity is charged on the support surface 2a of the support unit 2, and the object K is held by the support surface 2a. When the dechuck voltages are applied to the first electrode 5 and the second electrode 6, voltages in which positive and negative are inverted are periodically applied to the first electrode 5 and the second electrode 6, and the static electricity is removed from the support surface 2a of the support unit 2. Then, application of the pair of AC voltages is stopped when voltage values thereof become 0 (when the voltage values reach a ground voltage), and thus the object K can be separated from the support surface 2a. Details thereof will be described later.

Figure 2:
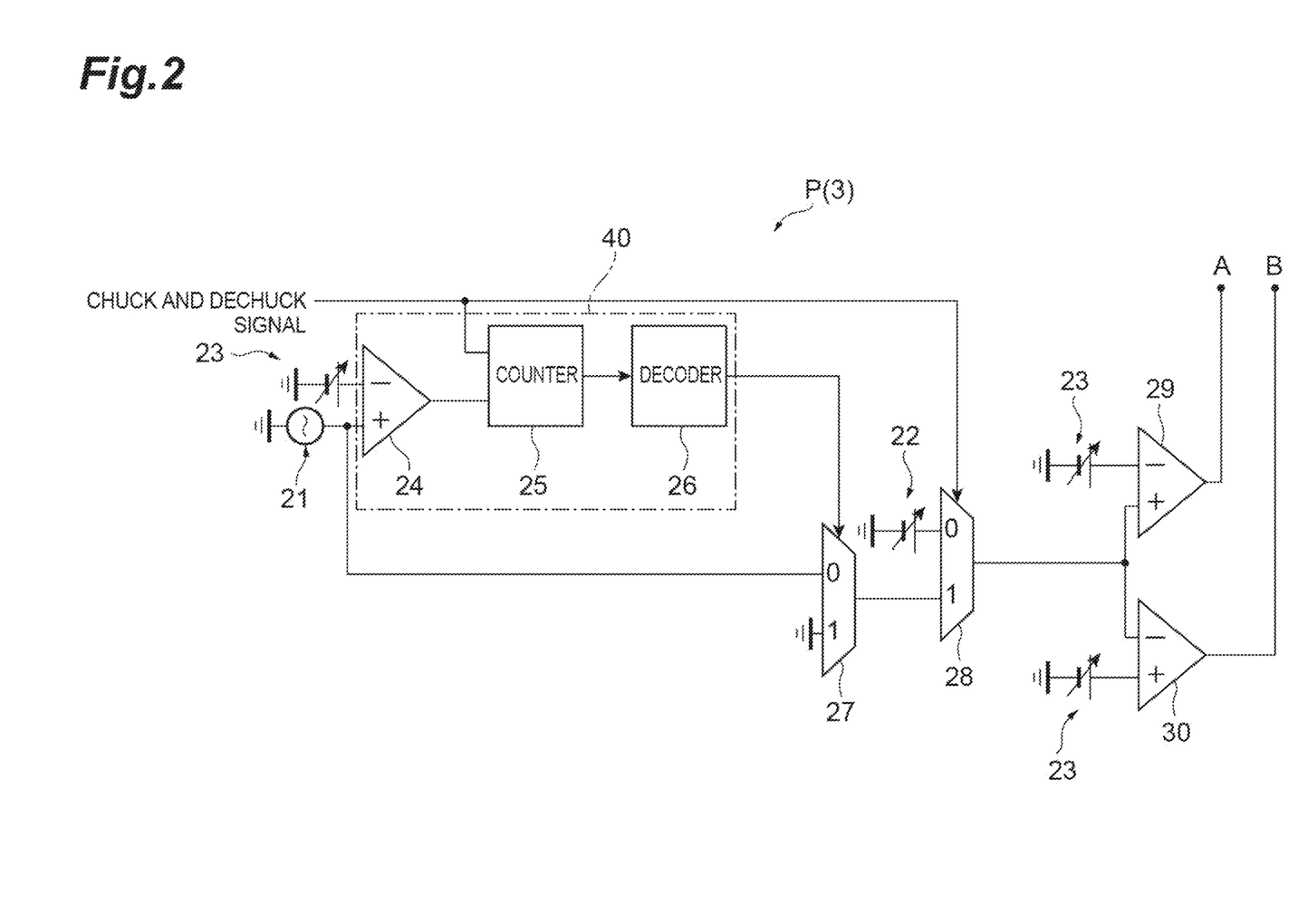
FIG. 2 is a circuit diagram illustrating a configuration example of a voltage application unit.

FIG. 2 is a circuit diagram illustrating a configuration example of the voltage application unit 3. As illustrated in the same drawing, the voltage application unit 3 includes an AC power supply 21, a DC power supply 22, and a cross-voltage adjustment unit 23. In addition, the voltage application unit 3 includes a comparator 24, a counter 25, a decoder 26, a first selector 27, a second selector 28, a first high-voltage amplifier 29, and a second high-voltage amplifier 30.

The AC power supply 21 is a single-phase power supply that outputs an AC voltage at the time of dechuck. The AC power supply 21 is connected to the comparator 24 and the first selector 27. The DC power supply 22 is a power supply that outputs a DC voltage at the time of chuck. The DC power supply 22 is connected to the second selector 28. The cross-voltage adjustment unit 23 is a DC power supply for adjusting an offset amount of the AC voltage at the time of dechuck. The cross-voltage adjustment unit 23 is connected to the comparator 24, the first high-voltage amplifier 29, and the second high-voltage amplifier 30, respectively. The first high-voltage amplifier 29 is connected to the first electrode 5, and the second high-voltage amplifier 30 is connected to the second electrode 6.

The comparator 24 is a portion that determines positive and negative of an AC voltage that is input from the AC power supply 21. The comparator 24 compares an AC voltage that is output from the AC power supply 21 and a DC voltage that is output from the cross-voltage adjustment unit 23, and outputs an output signal corresponding to a period of the AC voltage to the counter 25. The counter 25 is a portion that receives an input of a chuck and dechuck signal, and measures the number of times of input of the output signals transmitted from the comparator 24 at the time of dechuck. The decoder 26 is a portion that detects the number of times of polarity inversion of the AC voltage that is output from the AC power supply 21. In a case where the number of times of polarity inversion reaches the number of times set in advance, the decoder 26 outputs an output signal indicating the gist to the first selector 27.

The comparator 24, the counter 25, and the decoder 26 constitutes an information output unit 40 (to be described later) that outputs information on timing T at which a first waveform W1 of a first AC voltage Va1 and a second waveform W2 of a second AC voltage Va2 intersect each other.

The first selector 27 selectively inputs an output voltage of one of the AC power supply 21 and a ground voltage to the second selector 28 on the basis of an output signal from the decoder 26. The second selector 28 receives an input of the chuck and dechuck signal, and selectively inputs an output voltage of one of the DC power supply 22 and the first selector 27 to the first high-voltage amplifier 29 and the second high-voltage amplifier 30. The first high-voltage amplifier 29 and the second high-voltage amplifier 30 amplify an input voltage from the second selector 28 and the cross-voltage adjustment unit 23, and apply a voltage after amplification to the first electrode 5 and the second electrode 6.

Figure 3:
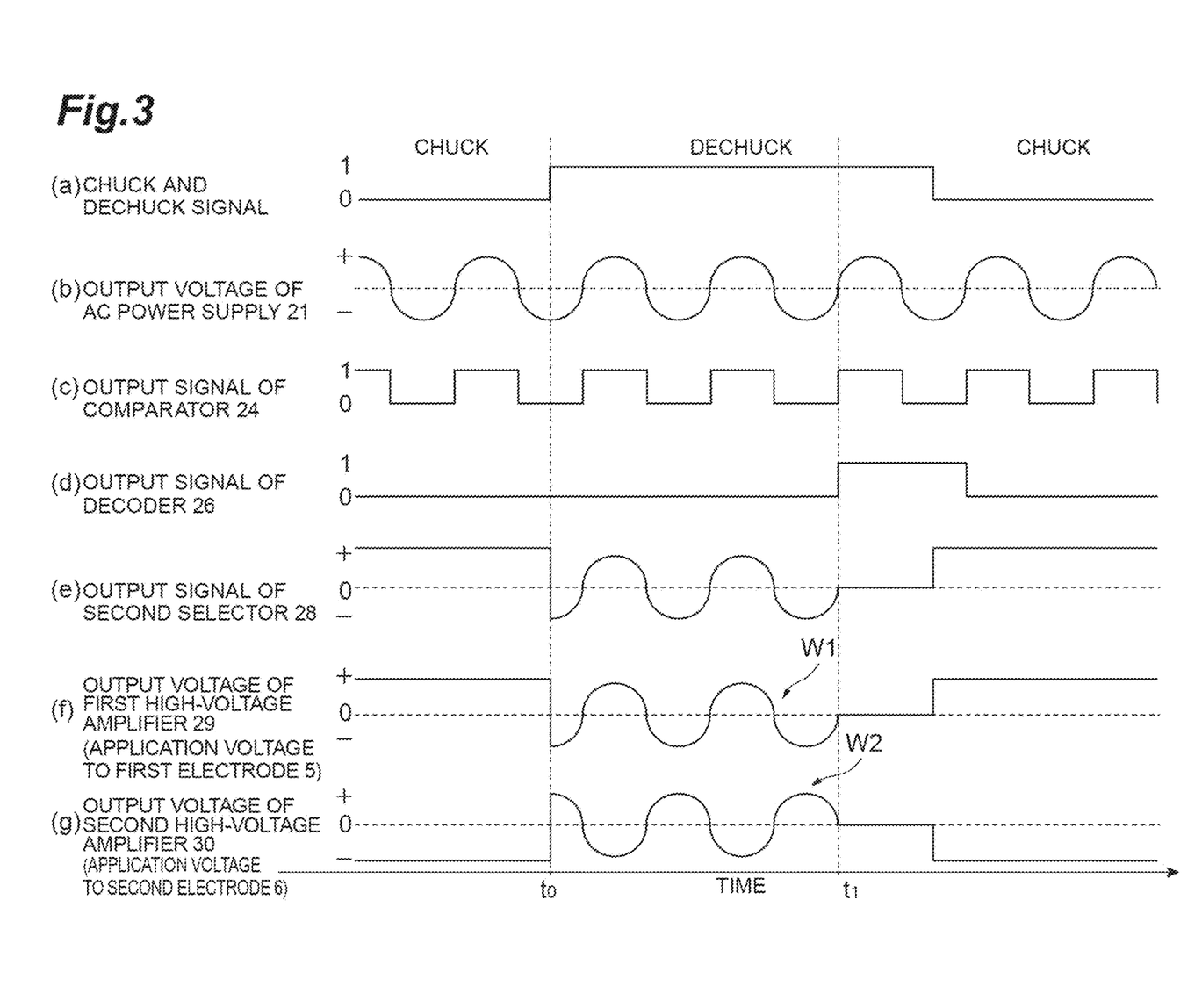
FIG. 3 is a view illustrating an example of various signals and an output voltage which are used in the voltage application unit.

FIG. 3 is a view illustrating an example of various signals and output voltages which are used in the voltage application unit 3. An operation of the voltage application unit 3 can be switched on the basis of the chuck and dechuck signal input from the outside. As illustrated in FIG. 3(a), the chuck and dechuck signal becomes 0 at the time of chuck and becomes 1 at the time of dechuck. That is, the chuck and dechuck signal becomes a chuck signal that gives an instruction for a chuck operation to the electrostatic chuck device 1 when a value thereof is 0, and becomes a dechuck signal that gives an instruction for a dechuck operation to the electrostatic chuck device 1 when a value thereof is 1 at time t0. As illustrated in FIG. 3(b), an output voltage of the AC power supply 21 is an AC voltage having a constant frequency and a constant amplitude at the time of chuck and at the time of dechuck.

As illustrated in FIG. 3(c), an output signal of the comparator 24 becomes 1 in a period in which an output voltage of the AC power supply 21 is positive (including 0), and becomes 0 in a period in which the output voltage is negative. As illustrated in FIG. 3(d), at the time of dechuck, if the number of times of polarity inversion of the AC voltage reaches the number of times set in advance after time t1, an output signal of the decoder 26 becomes 1 until the subsequent chuck signal arrives. An output signal of the decoder 26 becomes 0 in other periods.

As illustrated in FIG. 3(e), an output signal of the second selector 28 has a constant positive value at the time of chuck, and becomes an AC signal having the same waveform as in the output voltage of the AC power supply 21 at the time of dechuck. An output signal of the second selector 28 becomes 0 in a period in which the output signal of the decoder 26 becomes 1 at the time of dechuck.

An output voltage of the first high-voltage amplifier 29 is a voltage that is applied to the first electrode 5. As illustrated in FIG. 3(f), the output voltage of the first high-voltage amplifier 29 becomes a positive DC voltage at the time of chuck, and becomes an AC voltage (first AC voltage Va1 to be described later) corresponding to the output signal of the second selector 28 at the time of dechuck at time t0. An output voltage of the second high-voltage amplifier 30 is a voltage that is applied to the second electrode 6. As illustrated in FIG. 3(g), the output voltage of the second high-voltage amplifier becomes a negative DC voltage at the time of chuck and becomes an AC voltage (second AC voltage Va2 to be described later) in which positive and negative are inverted from the output signal of the second selector 28 at the time of dechuck at time t0. The output voltage of the first high-voltage amplifier 29 and the output voltage of the second high-voltage amplifier 30 becomes 0 in a period in which the output signal of the decoder 26 becomes 1 at the time of dechuck at time t1.

FIG. 4 is a view illustrating an example of control of a chuck voltage and a dechuck voltage by the voltage application unit 3. In FIG. 4, as can be conceptually understood, differently from FIG. 3, values of the output voltage (an application voltage to the first electrode 5) of the first high-voltage amplifier 29 and the output voltage (application voltage to the second electrode 6) of the second high-voltage amplifier 30 at time to are set to 0 in combination. As illustrated in the same drawing, a first DC voltage Vd1 is applied to the first electrode 5 and a second DC voltage Vd2 is applied to the second electrode 6 at the time of chuck. Here, the first DC voltage Vd1 is a positive voltage, and the second DC voltage Vd2 is a negative voltage. In the first DC voltage Vd1 and the second DC voltage Vd2, polarities are different from each other, and absolute values of voltages are the same as each other. When chuck is switched into dechuck at time t0 (the chuck signal is switched into the dechuck signal), the voltages which are applied to the first electrode 5 and the second electrode 6 are switched from a DC voltage to an AC voltage.

At the time of dechuck, the first AC voltage Va1 is applied to the first electrode 5 and the second AC voltage Va2 is applied to the second electrode 6. In this embodiment, the first waveform W1 indicated by the first AC voltage Va1 and the second waveform W2 indicated by the second AC voltage Va2 have the same amplitude and phases opposite to each other. A potential when the first waveform W1 and the second waveform W2 intersect each other is adjusted by an offset amount of the first AC voltage Va1 and the second AC voltage Va2. Here, the offset amount of the first AC voltage Va1 and the second AC voltage Va2 is adjusted so that voltage values of the first AC voltage Va1 and the second AC voltage Va2 become zero when the first waveform W1 and the second waveform W2 intersect each other.

In a case where one period of the first AC voltage Va1 and the second AC voltage Va2 is set to 2 π, the period indicated by the first waveform W1 and the second waveform W2 when initiating application of the dechuck voltages, that is, at time t0 is equal to or greater than 0 and less than ½ π and equal to or greater than π and less than ³⁄₂ π. In the example in FIG. 4, at time t0, the period indicated by the first waveform W1 is π and the period indicated by the second waveform W2 is 0. Accordingly, in switching from chuck to dechuck, that is, at time t0, a polarity of a voltage that is applied to the first electrode 5 and a polarity of a voltage that is applied to the second electrode 6 are inverted from each other. Positive and negative absolute values of the first AC voltage Va1 and the second AC voltage Va2 are 0 at time t0. The absolute values gradually increase after time t0, and reach a first peak after passage of time corresponding to ½ π. Accordingly, when initiating application of the dechuck voltages, time taken until the positive and negative absolute values of the first AC voltage Va1 and the second AC voltage Va2 reach the first peak is further shortened in comparison to a case where the periods indicated by the first waveform W1 and the second Waveform W2 at Time t0 are Equal to or Greater than ½ π and Less than π, and equal to or greater than ³⁄₂ π and less than 2π.

After application of the dechuck voltages, at timing T at which the first waveform W1 and the second waveform W2 intersect each other, application of the dechuck voltages to the first electrode 5 and the second electrode 6 is stopped. Specifically, the information output unit 40 outputs dechuck voltage application stoppage signal Dt to the first selector 27 on the basis of a timing signal Ts that is information on timing T at which the first waveform W1 and the second waveform W2 intersect each other. After receiving the dechuck voltage application stoppage signal Dt, the first selector 27 inputs a ground voltage to the second selector 28. In addition, after receiving an input of a dechuck signal, the second selector 28 inputs the ground voltage of the first selector 27 to the first high-voltage amplifier 29 and the second high-voltage amplifier 30. According to this, application of the dechuck voltages to the first electrode 5 and the second electrode 6 is stopped (refer to FIG. 2).

In the example illustrated in FIG. 4, when the first waveform W1 and the second waveform W2 intersect each other for the first time at time t0, the information output unit 40 acquires a timing signal Ts1 related to timing T1. When the first waveform W1 and the second waveform W2 intersect each other for the second time after time t0, the information output unit 40 acquires a timing signal Ts2 related to timing T2. When the first waveform W1 and the second waveform W2 intersect each other for the third time after time t0, the information output unit 40 acquires a timing signal Ts3 related to timing T3. When the first waveform W1 and the second waveform W2 intersect each other for the fourth time at time t1, the information output unit 40 acquires a timing signal Ts4 related to timing T4. The information output unit 40 receives the timing signal Ts4 and outputs the dechuck voltage application stoppage signal Dt. According to this, application of the dechuck voltages to the first electrode 5 and the second electrode 6 is stopped.

In this embodiment, the first AC voltage Va1 and the second AC voltage Va2 are controlled always to be output in a desired state. According to this, the timing signal Ts that is information related to the timing T at which the first waveform W1 and the second waveform W2 intersect each other can be output from the comparator 24 of the information output unit 40 even when an actual AC voltage is not detected. That is, since timing at which positive and negative determination of the AC voltage output from the AC power supply 21 is switched (polarity inversion) is the same as the timing T at which the first waveform W1 and the second waveform W2 intersect each other, an output signal of the comparator 24 becomes the timing signal Ts. After receiving an input of the dechuck signal, the counter 25 measures the number of times of input of the timing signal Ts from the comparator 24 after time at which dechuck is initiated, and outputs a measurement result toward the decoder 26. In a case where the number of times of the timing signal Ts synchronized with the number of times of polarity inversion reaches the number of times set in the decoder 26 in advance, the decoder 26 outputs the dechuck voltage application stoppage signal Dt to the first selector 27.

A determination as to whether to stop application of the dechuck voltages at which timing T at which the first waveform W1 and the second waveform W2 intersect each other is appropriately made, for example, the kind of the object K or the support unit 2, a voltage value of the chuck voltage, an amplitude and a frequency of the dechuck voltages, and the like. In a case of adjusting timing of stopping application of the dechuck voltages, that is, timing at which the dechuck voltage application stoppage signal Dt is output by the information output unit 40, the number of times of intersection of the first waveform W1 and the second waveform W2 (the number of times of set of the decoder 26) may be changed. Dechuck conditions can also be adjusted by changing voltage values, amplitudes, or frequencies of the first AC voltage Va1 and the second AC voltage Va2. In this case, for example, the dechuck conditions can be adjusted by changing an amplitude or a frequency of the AC power supply 21.

Figure 5:
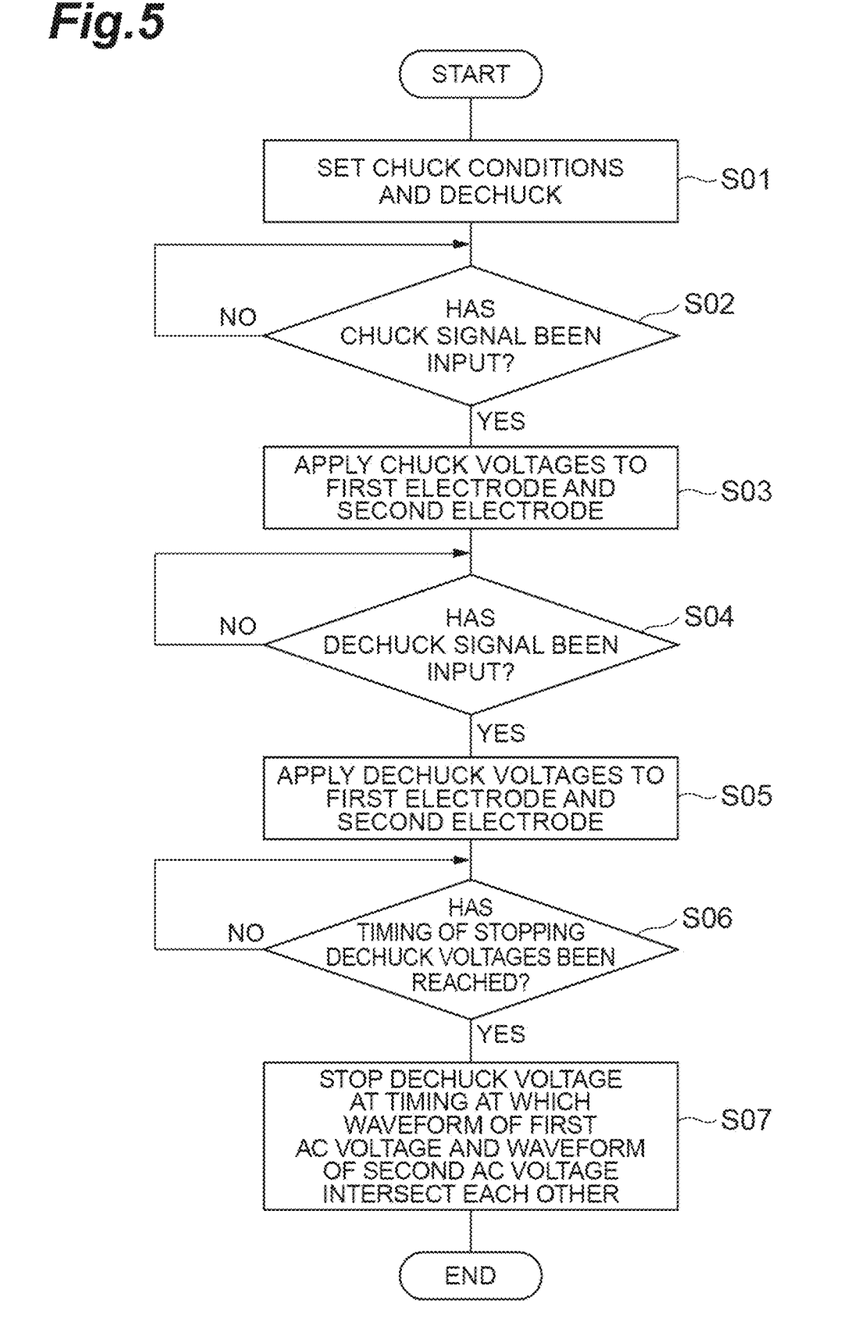
FIG. 5 is a flowchart illustrating an operation of the electrostatic chuck device.

Continuously, an operation of the above-described electrostatic chuck device 1 will be described. FIG. 5 is a flowchart illustrating the operation of the electrostatic chuck device 1.

As illustrated in FIG. 5, in the electrostatic chuck device 1, first, chuck conditions and dechuck conditions are set (step S01). At step S01, for example, voltage values of the first DC voltage Vd1 and the second DC voltage Vd2 which are used at the time of chuck, waveforms, frequencies, amplitudes, and an offset amount of the first AC voltage Va1 and the second AC voltage Va2 which are used at the time of dechuck, timing of stopping the dechuck voltages, and the like are set.

After setting the chuck conditions and the dechuck conditions, a determination is made as to whether or not the chuck signal has been input (step S02). In a case where the chuck signal is not input, the determination in step S02 is repeated until the chuck signal is input. In a case where the chuck signal has been input, chuck voltages (the first DC voltage Vd1 and the second DC voltage Vd2) are applied to the first electrode 5 and the second electrode 6 (step S03). Due to application of the chuck voltages to the first electrode 5 and the second electrode 6, static electricity is charged on the support surface 2a of the support unit 2, and the object K is held by the support surface 2a. Various treatments such as conveyance and processing are performed on the object K which is held on the support surface 2a.

After application of the chuck voltages, a determination is made as to whether or not the dechuck signal has been input (step S04). In a case where the dechuck signal is not input, holding of the object K on the support surface 2a continues, and the determination in step S04 is repeated until the dechuck signal is input. In a case where the dechuck signal has been input, dechuck voltages (the first AC voltage Va1 and the second AC voltage Va2) are applied to the first electrode 5 and the second electrode 6 (step S05). Due to application of the dechuck voltages, voltages in which positive and negative are inverted are periodically applied to the first electrode 5 and the second electrode 6, and the static electricity is removed from the support surface 2a of the support unit 2.

After initiating application of the dechuck voltages, a determination is made as to whether or not the dechuck voltage stoppage timing set in step S01 has been reached (step S06). In a case where the set timing has not been reached, application of the dechuck voltages continues, and the determination in step S06 is repeated until reaching the timing. In a case where the set timing is reached, application of the dechuck voltages is stopped at timing at which the waveform of the first AC voltage Va1 and the waveform of the second AC voltage Va2 intersect each other (step S07). When voltage values of the first AC voltage Va1 and the second AC voltage Va2 become the ground voltage, application of the first AC voltage Va1 and the second AC voltage Va2 is stopped in order for the object K to be separated from the support surface 2a.

As described above, in the electrostatic chuck device 1, application of the dechuck voltages to the first electrode 5 and the second electrode 6 is stopped on the basis of information on the timing at which the first waveform W1 and the second waveform W2 intersect each other at the time of dechuck. According to the configuration, application of the dechuck voltages to the first electrode 5 and the second electrode 6 can be positively stopped at timing suitable for separation of the object K without waiting attenuation of the first AC voltage Va1 and the second AC voltage Va2. Accordingly, in the electrostatic chuck device 1, it is possible to shorten time taken until the object K is separated from the support unit 2 at the time of dechuck.

In this embodiment, the information output unit 40 retains information in advance on the basis of the first AC voltage Va1 and the second AC voltage Va2. According to this, in the information output unit 40, the information can be appropriately output, and application of the dechuck voltages can be stopped at timing suitable for separation of the object K. Accordingly, it is possible to shorten time taken until the object K is separated from the support unit 2 at the time of dechuck.

In this embodiment, the voltage application unit 3 applies the dechuck voltages to the first electrode 5 and the second electrode 6 so that the first waveform W1 and the second waveform W2 have phases opposite to each other. Accordingly, since positive and negative potentials are alternately applied to the first electrode 5 and the second electrode 6, it is possible to improve removal efficiency for charges in the support unit 2 by the first AC voltage Va1 and the second AC voltage Va2.

In this embodiment, the voltage application unit 3 applies the dechuck voltages to the first electrode 5 and the second electrode 6 so that values of the first AC voltage Va1 and the second AC voltage Va2 become zero in combination when the first waveform W1 and the second waveform W2 intersect each other. Accordingly, since application of the dechuck voltages can be stopped when the voltage values of the first AC voltage Va1 and the second AC voltage Va2 become zero, dechuck reliability can be improved.

In this embodiment, the voltage application unit 3 applies the dechuck voltages to the first electrode 5 and the second electrode 6 so that periods indicated by the first waveform W1 and the second waveform W2 when initiating application of the dechuck voltages become equal to or greater than 0 and less than $\frac{1}{2}\pi$ and equal to or greater than $\pi$ and less than $\frac{3}{2}\pi$ in a case where one period of the first waveform W1 and the second waveform W2 is set to $2\pi$. Accordingly, it is possible to shorten time taken until positive and negative absolute values of the first AC voltage Va1 and the second AC voltage Va2 becomes maximum values after initiating application of the dechuck voltages. Accordingly, it is possible to more effectively shorten time taken until the object K is separated from the support unit 2 at the time of dechuck.

In this embodiment, the voltage application unit 3 applies the dechuck voltages to the first electrode 5 and the second electrode 6 so that the first waveform W1 and the second waveform W2 have the same amplitude. Accordingly, since the first waveform W1 and the second waveform W2 are caused to have positive and negative symmetry, it is possible to improve removal efficiency for charges in the support unit 2 by the first AC voltage Va1 and the second AC voltage Va2.

In this embodiment, the voltage application unit 3 inverts a polarity of a voltage applied to the first electrode 5 and a polarity of a voltage applied to the second electrode 6 in switching from a chuck voltage used when chucking the object K to the dechuck voltage. In this case, it is possible to initiate removal of charges in the support unit 2 from time immediately after initiating dechuck. Accordingly, it is possible to more effectively shorten time taken until the object K is separated from the support unit 2 at the time of dechuck.

Figure 6:
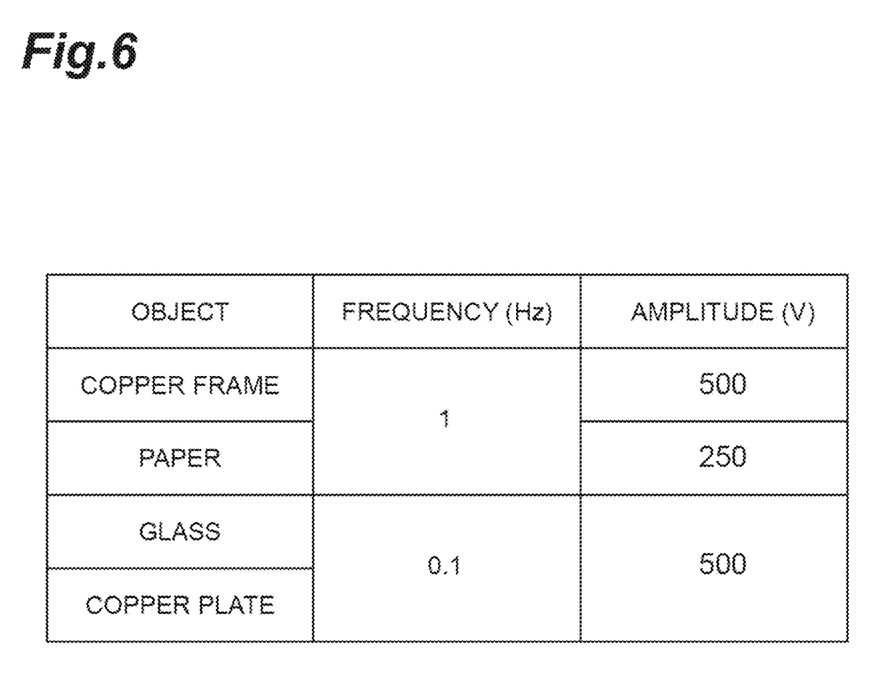
FIG. 6 is a view illustrating a verification result of dechuck conditions for an object to be held.

FIG. 6 is a view illustrating a verification result of the dechuck conditions for the object K. In this verification test, frequencies and amplitudes of the first AC voltage Va1 and the second AC voltage Va2 were set as parameters. In addition, in a state in which the object K is held on the support surface 2a that faces a vertically downward side, the dechuck voltages were applied to the first electrode 5 and the second electrode 6, and conditions in which time taken until the object K is dropped from the support surface 2a after application of the dechuck voltages (dechuck time) is the shortest are obtained. The kind of the object K was set to four kinds including a copper frame, paper, glass, and a copper plate. A chuck voltage is set to ±1200 V.

From results illustrated in FIG. 6, in the copper frame, dechuck time was the shortest in a case where frequencies of the first AC voltage Va1 and the second AC voltage Va2 were set to 1 Hz, and an amplitude was set to 500 V. In the paper, dechuck time was the shortest in a case where frequencies of the first AC voltage Va1 and the second AC voltage Va2 were set to 1 Hz, and an amplitude was set to 250 V. In the glass and the copper plate, dechuck time was the shortest in a case where frequencies of the first AC voltage Va1 and the second AC voltage Va2 were set to 0.1 Hz, and an amplitude was set to 500 V. In any object K, the dechuck time was approximately one second.

Figure 7:
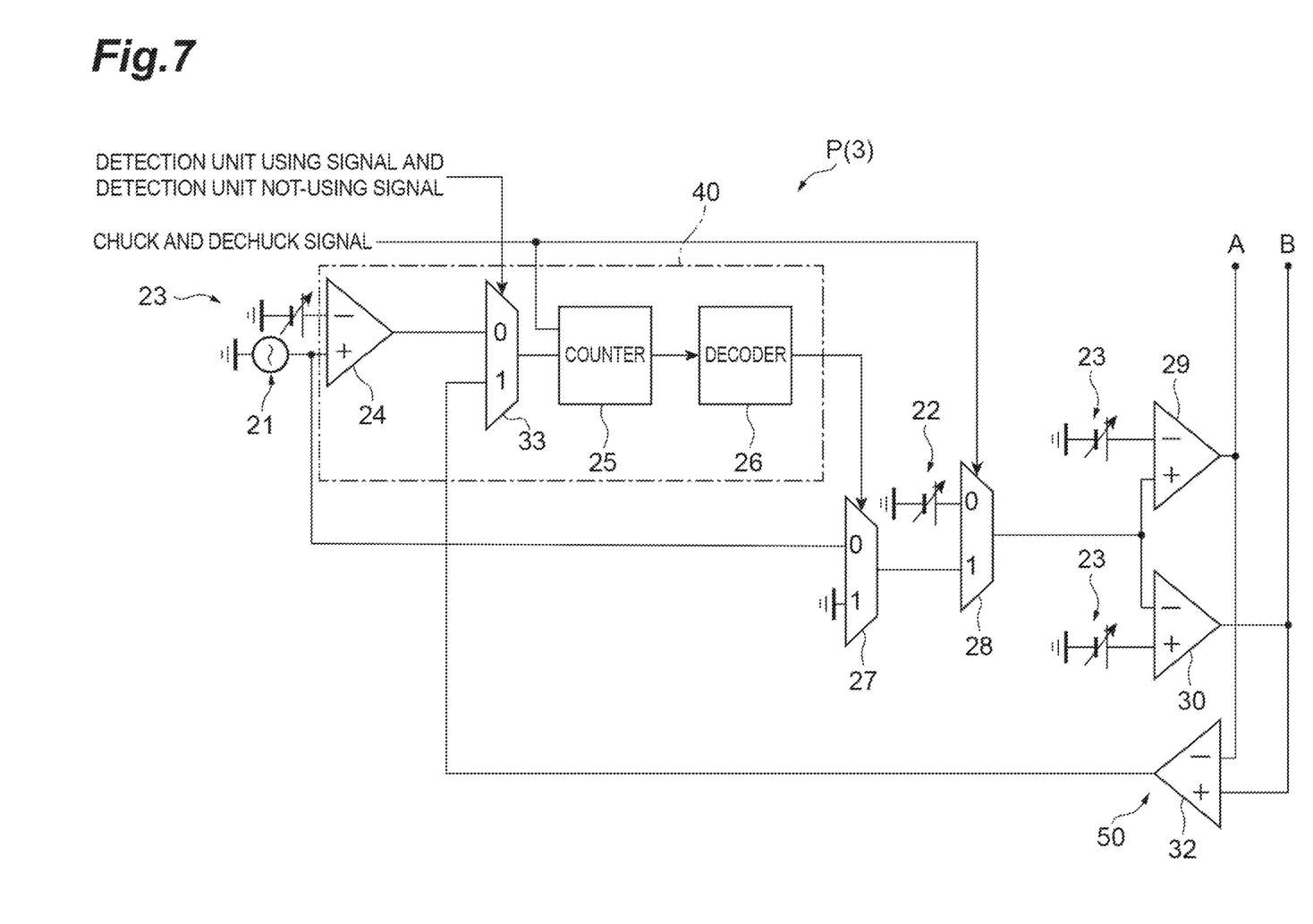
FIG. 7 is a circuit diagram illustrating a modification example of the voltage application unit.

The present disclosure is not limited to the above-described embodiment. In the above-described embodiment, the timing signal Ts is acquired by determining positive and negative of the AC voltages output from the AC power supply 21 by using the comparator 24, but as illustrated in FIG. 7, the timing signal Ts may be acquired by detecting timing T at which the first waveform W1 and the second waveform W2 intersect each other by using a detection unit 50 that directly detects the first AC voltage Va1 and the second AC voltage Va2. Specifically, a comparator 32 that constitutes the detection unit 50 may detect timing at which a value of the first AC voltage Va1 and a value of the second AC voltage Va2 equal to each other, that is, the timing T at which the first waveform W1 and the second waveform W2 intersect each other, and may input the detected value to a third selector 33 as a detection signal Ds.

In this case, the signal described in FIG. 2 is input to the third selector 33 also from the comparator 24. The third selector 33 selects any one signal among signals input from the comparator 32 and the comparator 24, and outputs the timing signal Ts corresponding to the signal to the counter 25.

In addition, the third selector 33 may receive an input of a detection unit using signal or a detection unit not-using signal which are signals indicating whether or not to use the detection unit 50. In a case where the detection unit 50 is used, the third selector 33 receives the input of the detection unit using signal, selects a detection signal Ds input from the comparator 32, and outputs the timing signal Ts based on the detection signal Ds to the counter 25. In a case where the detection unit 50 is not used, the third selector 33 receives the input of the detection unit not-using signal, selects a signal input from the comparator 24, and outputs the timing signal Ts corresponding to the signal to the counter 25. An output of the AC power supply 21 may be adjusted by using detection information in the detection unit 50 to stabilize characteristics of the AC power supply 21.

According to this aspect, the information output unit 40 acquires the timing signal Ts through detection of the first AC voltage Va1 and the second AC voltage Va2. According to this, the information output unit 40 can appropriately output the dechuck voltage application stoppage signal Dt, and can stop application of the dechuck voltages at the timing T suitable for separation of the object K. Accordingly, it is possible to shorten time taken until the object K is separated from the support unit 2 at the time of dechuck. In addition, appropriate timing T can be obtained by directly detecting the first AC voltage Va1 and the second AC voltage Va2, for example, even in a case where characteristics of the AC power supply 21 is not stable.

In the above-described embodiment, the number of arrangement of comb-like electrodes of the first electrode 5 and the number of arrangement of comb-like electrodes of the second electrode 6 inside the insulator 4 are the same as each other, but the number of arrangement of the electrodes may be different from each other. The first electrode 5 and the second electrode 6 inside the insulator 4 may have a configuration in which the comb-like electrodes are not provided, and areas of the first electrode 5 and the second electrode 6 when viewed from a normal direction of the support surface 2a may be different from each other. In this case, the first AC voltage Va1 and the second AC voltage Va2 which are used at the time of dechuck may deviate from an opposite phase state, or amplitudes or frequencies may be different from each other. At the time of dechuck, a voltage value when the waveform of the first AC voltage Va1 and the waveform of the second AC voltage Va2 intersect each other may be offset to any one of positive and negative with respect to zero.

REFERENCE SIGNS LIST

1: electrostatic chuck device, 2: support unit, 2a: support surface, 3: voltage application unit, 4: insulator, 5: first electrode, 6: second electrode, K: object, P: power supply for electrostatic chuck device, Ts: timing signal (information), Vd1: first DC voltage (chuck voltage), Vd2: second DC voltage (chuck voltage), Va1: first AC voltage (dechuck voltage), Va2: second AC voltage (dechuck voltage).

The invention claimed is:

1. A power supply for an electrostatic chuck device, comprising:
 a voltage application unit configured to apply a dechuck voltage that is used when dechucking an object to be held to a first electrode and a second electrode,
 the dechuck voltage being constituted by a first AC voltage applied to the first electrode in a first waveform, and a second AC voltage applied to the second electrode in a second waveform having a phase difference from the first waveform,
 wherein the voltage application unit stops application of the dechuck voltage to the first electrode and the second electrode on the basis of information on timing at which the first waveform and the second waveform intersect each other.

2. The power supply for an electrostatic chuck device according to claim 1, further comprising an information output unit configured to output the information.

3. The power supply for an electrostatic chuck device according to claim 2,
 wherein the information output unit acquires the information through detection of the first AC voltage and the second AC voltage.

4. The power supply for an electrostatic chuck device according to claim 2,
 wherein the information output unit retains the information based on the first AC voltage and the second AC voltage in advance.

5. The power supply for an electrostatic chuck device according to claim 1,
 wherein the voltage application unit applies the dechuck voltage to the first electrode and the second electrode so that the first waveform and the second waveform have phases opposite to each other.

6. The power supply for an electrostatic chuck device according to claim 5,
 wherein the voltage application unit applies the dechuck voltage to the first electrode and the second electrode so that values of the first AC voltage and the second AC voltage become zero when the first waveform and the second waveform intersect each other.

7. The power supply for an electrostatic chuck device according to claim 6,
 wherein the voltage application unit applies the dechuck voltage to the first electrode and the second electrode so that periods indicated by the first waveform and the second waveform when initiating application of the dechuck voltage become equal to or greater than 0 and less than $\frac{1}{2}\pi$ and equal to or greater than $\pi$ and less than $\frac{3}{2}\pi$ in a case where one period of the first waveform and the second waveform is set to $2\pi$.

8. The power supply for an electrostatic chuck device according to claim 1,
 wherein the voltage application unit applies the dechuck voltage to the first electrode and the second electrode so that the first waveform and the second waveform have the same amplitude.

9. The power supply for an electrostatic chuck device according to claim 1,
 wherein the voltage application unit inverts a polarity of a voltage applied to the first electrode and a polarity of a voltage applied to the second electrode in switching from a chuck voltage used when chucking the object to the dechuck voltage.

10. An electrostatic chuck device, comprising:
 the power supply for an electrostatic chuck device according to claim 1; and
 a support unit that includes a first electrode and a second electrode in an insulator.

11. A dechuck control method, comprising:
 applying a first AC voltage to a first electrode in a first waveform and applying a second AC voltage to a second electrode in a second waveform having a phase difference from the first waveform;
 and
 stopping application of the dechuck voltage to the first electrode and the second electrode on the basis of information on timing at which the first waveform and the second waveform intersect each other.

12. The dechuck control method according to claim 11 further comprising outputting the information.

13. The dechuck control method according to claim 12,
 wherein in the outputting, the information acquired through detection of the first AC voltage and the second AC voltage is output.

14. The dechuck control method according to claim 12,
 wherein in the outputting, the information retained in advance on the basis of the first AC voltage and the second AC voltage is output.

15. The dechuck control method according to claim 11,
 wherein in the applying, the dechuck voltage is applied to the first electrode and the second electrode so that the first waveform and the second waveform have phases opposite to each other.

16. The dechuck control method according to claim 15,
 wherein in the applying, the dechuck voltage is applied to the first electrode and the second electrode so that values of the first AC voltage and the second AC voltage become zero when the first waveform and the second waveform intersect each other.

17. The dechuck control method according to claim 16,
 wherein in the applying, the dechuck voltage is applied to the first electrode and the second electrode so that periods indicated by the first waveform and the second waveform when initiating application of the dechuck voltage become equal to or greater than 0 and less than $\frac{1}{2}\pi$ and equal to or greater than $\pi$ and less than $\frac{3}{2}\pi$ in a case where one period of the first waveform and the second waveform is set to 2 π.

18. The dechuck control method according to claim 11, wherein in the applying, the dechuck voltage is applied to the first electrode and the second electrode so that the first waveform and the second waveform have the same amplitude.

19. The dechuck control method according to claim 11, wherein in the applying, a polarity of a voltage applied to the first electrode and a polarity of a voltage applied to the second electrode are inverted in switching from a chuck voltage to the dechuck voltage.

\* \* \* \* \*